(12) United States Patent
Arai

(10) Patent No.: US 12,041,797 B2
(45) Date of Patent: Jul. 16, 2024

(54) PHOTOELECTRIC CONVERSION ELEMENT, DEVICE, AND POWER SUPPLY MODULE

(71) Applicant: RICOH COMPANY, LTD., Tokyo (JP)

(72) Inventor: Ryota Arai, Shizuoka (JP)

(73) Assignee: Ricoh Company, Ltd., Tokyo (JP)

( * ) Notice: Subject to any disclaimer, the term of this patent is extended or adjusted under 35 U.S.C. 154(b) by 485 days.

(21) Appl. No.: 17/424,642

(22) PCT Filed: Jan. 24, 2020

(86) PCT No.: PCT/JP2020/002589
§ 371 (c)(1),
(2) Date: Jul. 21, 2021

(87) PCT Pub. No.: WO2020/153492
PCT Pub. Date: Jul. 30, 2020

(65) Prior Publication Data
US 2022/0029116 A1    Jan. 27, 2022

(30) Foreign Application Priority Data
Jan. 25, 2019   (JP) .................................. 2019-011415

(51) Int. Cl.
H10K 30/82   (2023.01)
H10K 30/30   (2023.01)
H10K 85/20   (2023.01)

(52) U.S. Cl.
CPC ............. H10K 30/82 (2023.02); H10K 30/30 (2023.02); H10K 85/215 (2023.02)

(58) Field of Classification Search
CPC ....... H10K 30/82; H10K 30/30; H10K 85/215
See application file for complete search history.

(56) References Cited

U.S. PATENT DOCUMENTS 9,246,110 B2   1/2016   Arai et al.
9,373,450 B2   6/2016   Arai et al.
(Continued)

FOREIGN PATENT DOCUMENTS

EP   2072557 A1   6/2009
EP   2246382 A1   11/2010
(Continued)

OTHER PUBLICATIONS

International Search Report Issued Apr. 3, 2020 for counterpart International Patent Application No. PCT/JP2020/002589 filed Jan. 24, 2020.
(Continued)

Primary Examiner — Tae-Sik Kang
(74) Attorney, Agent, or Firm — Grüneberg and Myers PLLC

(57) ABSTRACT

A photoelectric conversion element including a substrate, and a photoelectric conversion layer disposed on or above the substrate, wherein the photoelectric conversion layer includes an organic material (A) represented by General Formula (1), an electron-donating material (B) having a repeating unit structure and having an energy level of the highest occupied molecular orbital (HOMO) being 5.0 eV or greater, and an electron-accepting material (C), wherein a mass ratio (A+B):C is from 1.0:1.0 through 3.0:1.0, where, in General Formula (1), $R_1$ is each independently an alkyl group having from 2 through 8 carbon atoms; n is each independently an integer of from 1 through 2; X1 and X2 are each independently a hydrogen atom or a halogen atom; and A is represented by General Formula (2), General Formula (3), or General Formula (4) and $R_2$ to $R_4$ are each independently an alkyl group having from 8 through 22 carbon atoms.

(Continued)

(56) References Cited

U.S. PATENT DOCUMENTS

| | | |
|---|---|---|
| 9,378,899 B2 | 6/2016 | Arai et al. |
| 9,406,887 B2 | 8/2016 | Arai et al. |
| 9,590,187 B2 | 3/2017 | Arai et al. |
| 2010/0006154 A1 | 1/2010 | Kitazawa et al. |
| 2010/0327271 A1 | 12/2010 | Uetani |
| 2011/0017300 A1 | 1/2011 | Uetani |
| 2012/0064443 A1 | 3/2012 | Arai et al. |
| 2013/0214208 A1 | 8/2013 | Mitchell et al. |
| 2014/0001411 A1 | 1/2014 | Blouin et al. |
| 2014/0034880 A1 | 2/2014 | Blouin et al. |
| 2014/0061538 A1 | 3/2014 | Blouin et al. |
| 2014/0209839 A1 | 7/2014 | Mitchell et al. |
| 2015/0041727 A1 | 2/2015 | Wang et al. |
| 2016/0111670 A1 | 4/2016 | Lee et al. |
| 2016/0155946 A1 | 6/2016 | Blouin et al. |
| 2016/0260912 A1 | 9/2016 | Arai et al. |
| 2017/0222150 A1* | 8/2017 | Arai ............... H10K 30/30 |
| 2017/0338424 A1* | 11/2017 | Arai ............... H10K 85/621 |
| 2018/0019412 A1 | 1/2018 | Quinlan et al. |
| 2021/0043846 A1 | 2/2021 | Arai et al. |

FOREIGN PATENT DOCUMENTS

| | | |
|---|---|---|
| JP | 5375218 B2 | 10/2013 |
| JP | 2013-543031 A | 11/2013 |
| JP | 2014-513743 A | 6/2014 |
| JP | 2014-515043 A | 6/2014 |
| JP | 2014-517853 A | 7/2014 |
| JP | 2014-528016 A | 10/2014 |
| JP | 2015-513572 A | 5/2015 |
| JP | 5791995 B2 | 8/2015 |
| JP | 2016-521920 A | 7/2016 |
| JP | 2016-524010 A | 8/2016 |
| JP | 2017-139437 A | 8/2017 |
| JP | 2017-206479 A | 11/2017 |

OTHER PUBLICATIONS

Written Opinion Issued Apr. 3, 2020 for counterpart International Patent Application No. PCT/JP2020/002589 filed Jan. 24, 2020.
Lee, H. K. H. et al., "Is organic photovoltaics promising for indoor applications?" Applied Physics letters, vol. 108, 253301, 2016, 253301-1-253301-5.
U.S. Office Action dated Aug. 15, 2023, in U.S. Appl. No. 16/980,302, 8 pages.
U.S. Appl. No. 16/980,302, filed Sep. 11, 2020, 2021/0043846, Arai et al.

* cited by examiner

8 Claims, 2 Drawing Sheets

[Fig. 1]
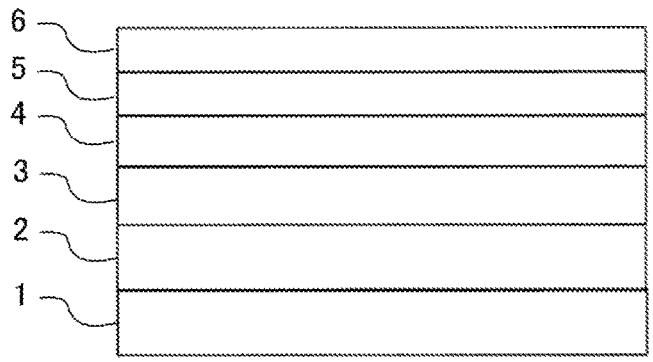
[Fig. 2]
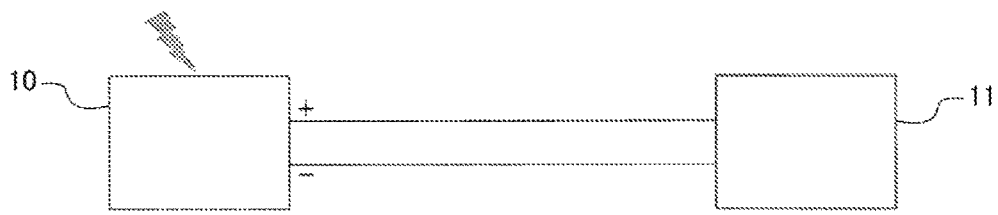
[Fig. 3]
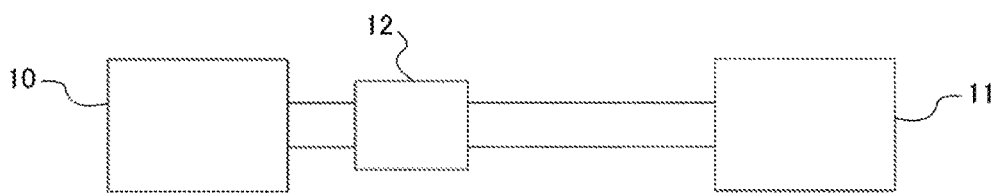
[Fig. 4]
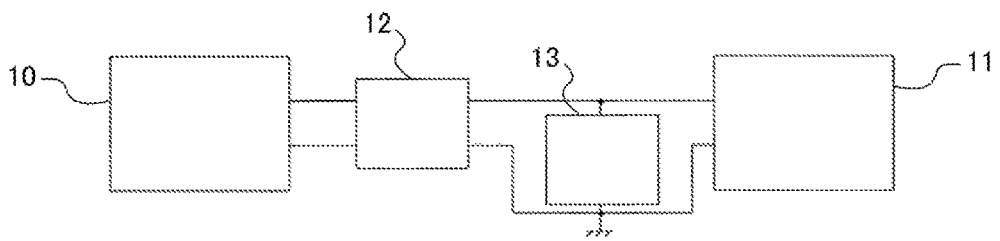
[Fig. 5]
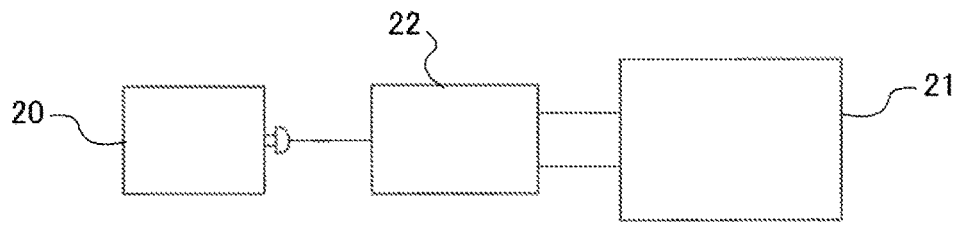
[Fig. 6]
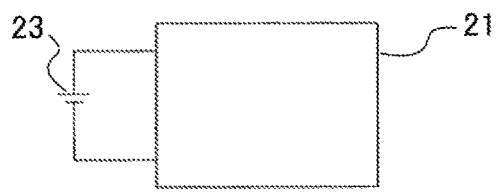

[Fig. 7]
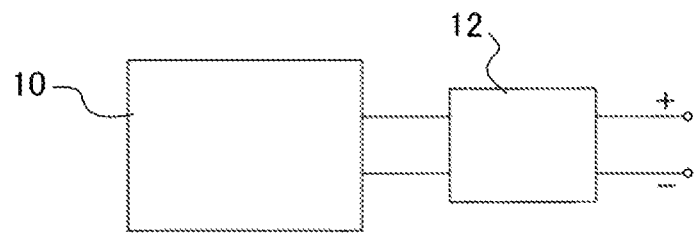
[Fig. 8]
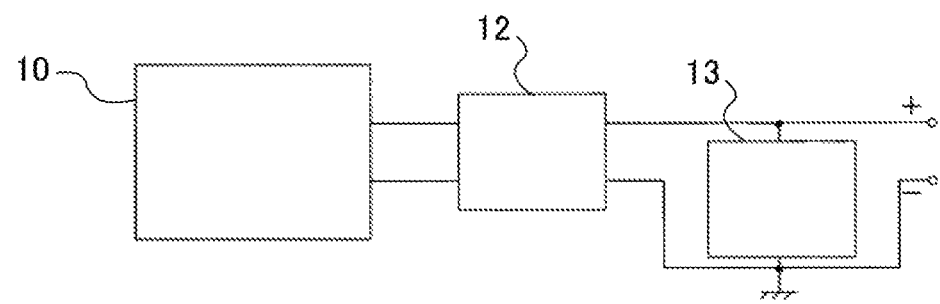
[Fig. 9]
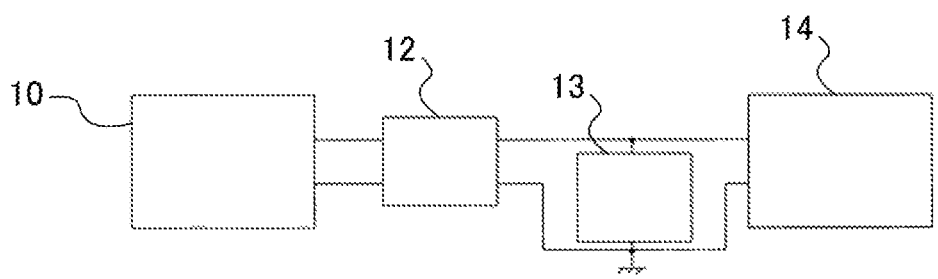
[Fig. 10]
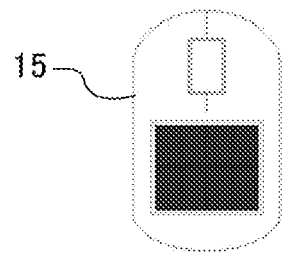

PHOTOELECTRIC CONVERSION ELEMENT, DEVICE, AND POWER SUPPLY MODULE

TECHNICAL FIELD

The present disclosure relates to a photoelectric conversion element, a device, and a power supply module.

BACKGROUND ART

In recent years, the power for driving electric circuits has become extremely low. Preparing for the coming IoT society, various electronic parts, such as sensors, have been able to be driven with very low electric power (order of microwatt). As utilization of sensors, applications of the sensors for energy harvesting elements have been expected as self-sufficient energy supplies capable of generating and consuming power in-situ. Among the energy harvesting elements, photoelectric conversion elements have been attracted attentions as elements capable of generating power anywhere as long as there is light. As energy harvesting elements, particularly demanded are photoelectric conversion elements capable of efficiently generating electric power with indoor light, such as light of fluorescent lamps, and light of LED lamps, and developments of materials having absorptions suitable for emission wavelengths of fluorescent lamps and LED lamps have been performed (NPL 1).

As demands of energy harvesting element increase, use thereof outdoor as well as indoor has been considered. Therefore, desired are materials and devices for energy harvesting elements having excellent efficiency with light sources and illuminance of indoor light and outdoor light.

As a photoelectric conversion element having high heat resistance, moreover, PTL 1 discloses a photoelectric conversion element including a photoelectric conversion layer that includes a specific first material having a thiophene skeleton and a benzodithiophene skeleton in a principle chain thereof and a second material having a fullerene skeleton.

CITATION LIST

Patent Literature

PTL 1: Japanese Unexamined Patent Application Publication No. 2017-139437

Non Patent Literature

NPL 1: Applied Physics letters 108, 253301 (2016)

SUMMARY OF INVENTION

Technical Problem

The present disclosure has an object to provide a photoelectric conversion element as an energy harvesting element having high power generation with light sources and illuminance of both indoor light and outdoor light.

Solution to Problem

The photoelectric conversion element of the present disclosure is as described below.

(1) A photoelectric conversion element including a substrate, and a photoelectric conversion layer disposed on or above the substrate. The photoelectric conversion layer includes an organic material (A) represented by General Formula (1) below, an electron-donating material (B) having a repeating unit structure and having an energy level of the highest occupied molecular orbital (HOMO) being 5.0 eV or greater, and an electron-accepting material (C). A mass ratio (A+B):C of the organic material (A), the electron-donating material (B), and the electron-accepting material (C) is from 1.0:1.0 through 3.0:1.0.

[Chem. 1]

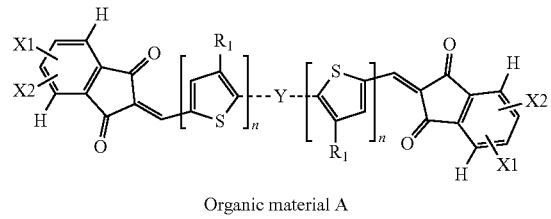

General Formula (1)

Organic material A

In General Formula (1), $R_1$ is each independently an alkyl group having from 2 through 8 carbon atoms; n is each independently an integer of from 1 through 2; X1 and X2 are each independently a hydrogen atom or a halogen atom; and Y is represented by General Formula (2), General Formula (3), or General Formula (4) below and $R_2$ to $R_4$ are each independently an alkyl group having from 8 through 22 carbon atoms.

[Chem.2]

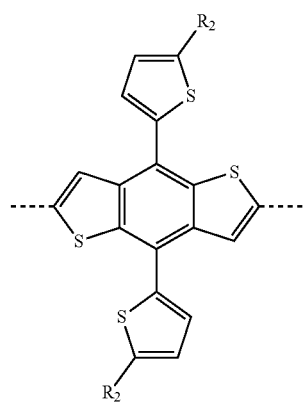

General Formula (2)

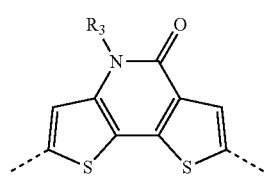

General Formula (3)

-continued

General Formula (4)

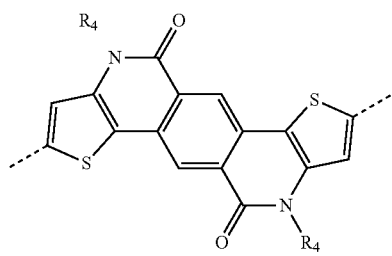

Advantageous Effects of Invention

The present disclosure can provide a photoelectric conversion element exhibiting an excellent photoelectric conversion performance, that is, a high efficiency can be obtained with both an indoor light source and an outdoor light source.

BRIEF DESCRIPTION OF DRAWINGS

FIG. 1 is a schematic cross-sectional view illustrating a structure of an embodiment of the photoelectric conversion element according to the present disclosure.

FIG. 2 is a schematic view illustrating an example of a basic structure of a device in which the photoelectric conversion element is mounted.

FIG. 3 is a schematic view illustrating a structure including a power supply IC for a device in which photoelectric conversion element is mounted.

FIG. 4 is a schematic view illustrating another structure where a power storage device is mounted between a power supply IC of a device in which the photoelectric conversion element is mounted and a device circuit.

FIG. 5 is a schematic view illustrating a structure of a device coupled with a commercial power supply for a conventional device, and driven by supplying direct current to a circuit of the device.

FIG. 6 is a schematic view illustrating a structure of a conventional device where a battery cell is mounted therein, and the device is driven by electricity of the battery cell.

FIG. 7 is a schematic view illustrating an example of the power supply module where the photoelectric conversion element and a power supply IC for the photoelectric conversion element are connected.

FIG. 8 is a schematic view illustrating an example of a power supply module where the photoelectric conversion element, a power supply IC for the photoelectric conversion element, and a power storage device are connected.

FIG. 9 is a view illustrating a schematic example where the photoelectric conversion element, a power supply IC, and a power storage device are combined and connected to a power supply of a control circuit of a mouse.

FIG. 10 is a view illustrating an image where the photoelectric conversion element is mounted in a mouse.

DESCRIPTION OF EMBODIMENTS

A photoelectric conversion element according to the present disclosure will be described below with reference to drawings.

Note that, the present disclosure is not limited to embodiments described below, and other embodiments, additions to the embodiments, and eliminations from the embodiments are also included in a scope of the present disclosure, as long as the above-mentioned changes are made within a scope at which a person skilled in the art can easily arrive, and any of the embodiments can exhibit functions and effects of the present disclosure.

In the present disclosure, the term "photoelectric conversion element" means an element which converts optical energy into electric energy, or an element which converts electric energy into optical energy. Specific examples of the photoelectric conversion element include solar cells and photo diodes.

The photoelectric conversion element will be described in detail below.

The present disclosure relates to the photoelectric conversion element of (1) below, but also includes (2) to (8) below as embodiments thereof.

(1) A photoelectric conversion element including:
a substrate; and
a photoelectric conversion layer disposed on or above the substrate, wherein the photoelectric conversion layer includes an organic material (A) represented by General Formula (1) below, an electron-donating material (B) having a repeating unit structure and having an energy level of the highest occupied molecular orbital (HOMO) being 5.0 eV or greater, and an electron-accepting material (C),
wherein a mass ratio (A+B):C of the organic material (A), the electron-donating material (B), and the electron-accepting material (C) is from 1.0:1.0 through 3.0:1.0,

[Chem.3]

General Formula (1)

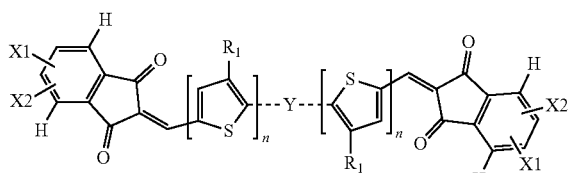

Organic material A where, in General Formula (1), $R_1$ is each independently an alkyl group having from 2 through 8 carbon atoms; n is each independently an integer of from 1 through 2; X1 and X2 are each independently a hydrogen atom or a halogen atom; and Y is represented by General Formula (2), General Formula (3), or General Formula (4) below and $R_2$ to $R_4$ are each independently an alkyl group having from 8 through 22 carbon atoms,

[Chem.4]

General Formula (2)

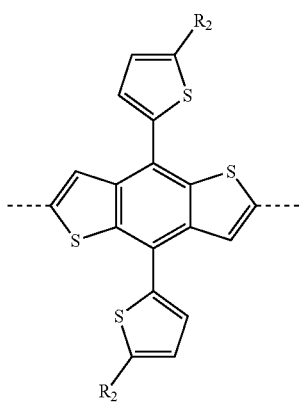

General Formula (3)

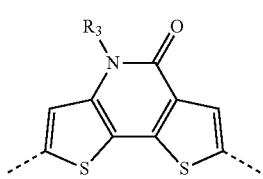

General Formula (4)

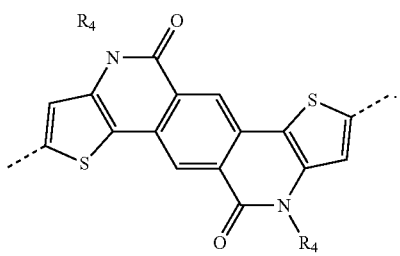

(2) The photoelectric conversion element according to (1),
wherein the electron-accepting material (C) is a fullerene derivative.

(3) The photoelectric conversion element according to (1) or (2),
wherein the photoelectric conversion element is a photoelectric conversion element including a first electrode, an electron-transporting layer, the photoelectric conversion layer, a hole-transporting layer, and a second electrode disposed on or above the substrate.

(4) The photoelectric conversion element according to (3),
wherein the electron-transporting layer includes at least one metal oxide selected from the group consisting of zinc oxide, titanium oxide, and tin oxide.

(5) The photoelectric conversion element according to (3) or (4),
wherein the hole-transporting layer includes at least one metal oxide selected from the group consisting of molybdenum oxide, tungsten oxide, and vanadium oxide.

The photoelectric conversion element according to any one of (3) to (5), wherein the electron-transporting layer includes a first layer including at least one metal oxide selected from the group consisting of zinc oxide, titanium oxide, and tin oxide, and a second layer disposed between the first layer and the photoelectric conversion layer, where the second layer includes an amine compound represented by General Formula (5) below,

[Chem.5]

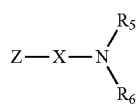

General Formula (5)

where, in General Formula (5), $R_5$ and $R_6$ are each independently an alkyl group having from 1 through 4 carbon atoms; X is a divalent aromatic group having from 6 through 14 carbon atoms or an alkylene group having from 1 through 4 carbon atoms; $R_5$ and $R_6$ may be bonded to form a ring; and Z is represented by one of substituents below,

—COOH

—P(=O)(OH)$_2$

—Si(OH)$_3$     [Chem. 6]

(7) A device including:
the photoelectric conversion element according to any one of (1) to (6), wherein the device is driven by electricity generated by the photoelectric conversion element.

(8) A power supply module including:
the photoelectric conversion element according to any one of (1) to (6).

<<Organic Material (A)>>

The organic material (A) included in the photoelectric conversion layer of the photoelectric conversion element of the present disclosure is represented by General Formula (1) below.

[Chem.7]

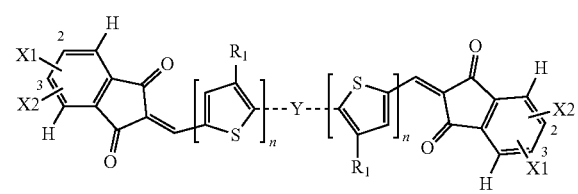

General Formula (1)

In General Formula (1), $R_1$ is each independently an alkyl group having from 2 through 8 carbon atoms; n is each independently an integer of from 1 through 2; X1 and X2 are each independently a hydrogen atom or a halogen atom; and Y is represented by General Formula (2), General Formula (3), or General Formula (4) below and $R_2$ to $R_4$ are each independently an alkyl group having from 8 through 22 carbon atoms.

[Chem.8]

General Formula (2)

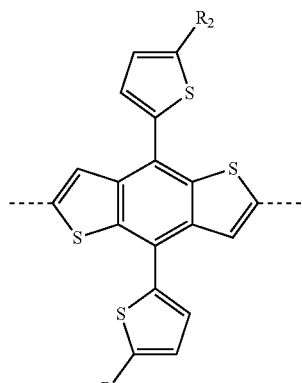

General Formula (3)

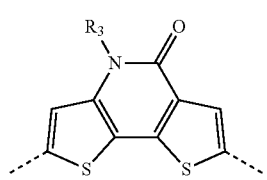

General Formula (4)

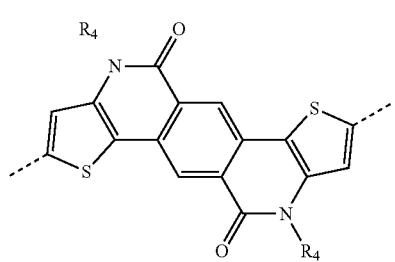

$R_1$ is an alkyl group having from 2 through 8 carbon atoms. Examples of the alkyl group include a n-butyl group, a n-hexyl group, and a n-octyl group. Among the above-listed examples, a n-hexyl group is preferable. $R_2$, $R_3$, and $R_4$ are each an alkyl group having from 8 through 22 carbon atoms. The alkyl group may be branched, and is preferably a branched alkyl group. Examples thereof include a 2-ethylhexyl group, a 2-butyloctyl group, and a 2-octyldodecyl group. $R_2$ is preferably a 2-ethylhexyl group and a 2-butyloctyl group. $R_3$ and $R_4$ are each preferably a 2-octyldodecyl group.

n is an integer of from 1 to 2, and is preferably 2.

X1 and X2 are each a hydrogen atom or a halogen atom, and are preferably a hydrogen atom or an iodine atom.

In General Formula (1) above, there are a plurality of $R_1$, n, X1, and X2. A plurality of $R_1$, n, X1, and X2 may be different from one another, but are preferably identical.

Regarding substitution positions, it is difficult to control 2 and 3 substitution positions in General Formula (1') below due to restriction of synthesis. In the case where $X_1$ and $X_2$ are not the same atoms, therefore, the organic material is a mixture of a 2-position substituted compound and a 3-position substituted compound.

[Chem.9]

General Formula (1')

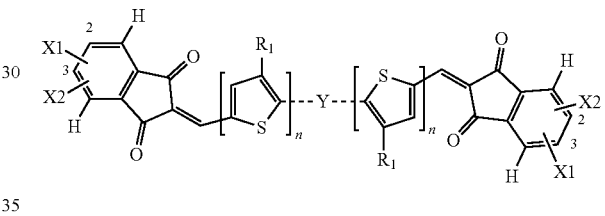

Specific examples of the organic material represented by General Formula (1) above include the compounds represented by the structural formulae below. However, the organic material for use in the present disclosure is not limited the compounds listed below.

TABLE 1

| Exemplified compound | Y | $R_1$ | n | X1 | X2 |
|---|---|---|---|---|---|
| 1 | ![structure with Bu/Et groups and thiophene-benzodithiophene-thiophene](Bu-CH(Et)-CH2-thiophene-benzodithiophene-thiophene-CH2-CH(Et)-Bu) | n-hexyl | 1 | H | H |

TABLE 1-continued
| Exemplified compound | Y | $R_1$ | n | X1 | X2 |
|---|---|---|---|---|---|
| 2 | 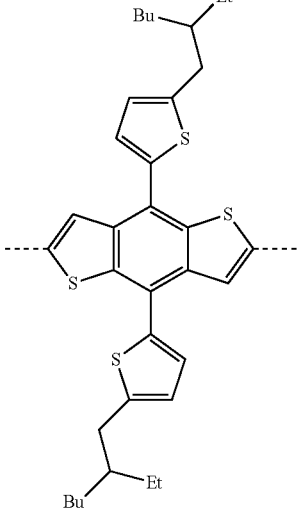 | n-hexyl | 2 | H | H |
| 3 | 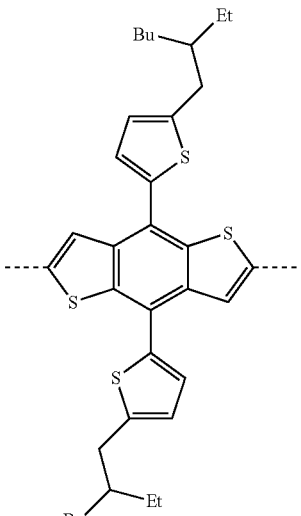 | n-hexyl | 1 | I | I |
| 4 | 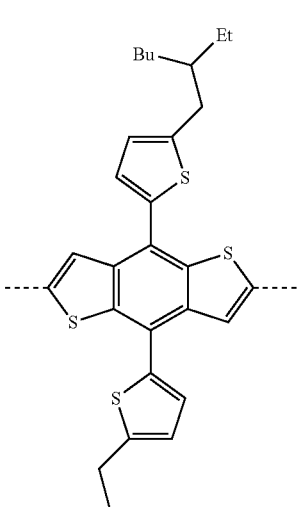 | n-hexyl | 2 | I | I |

TABLE 1-continued

| Exemplified compound | Y | R₁ | n | X1 | X2 |
|---|---|---|---|---|---|
| 5 | (structure with Bu/Et substituted bithiophene-benzodithiophene) | N-hexyl | 1 | Br | Br |
| 6 | (structure with Bu/Et substituted bithiophene-benzodithiophene) | n-hexyl | 2 | Br | Br |
| 7 | (structure with Bu/Hex substituted bithiophene-benzodithiophene) | n-hexyl | 1 | H | H |

TABLE 1-continued
| Exemplified compound | Y | R₁ | n | X1 | X2 |
|---|---|---|---|---|---|
| 8 | 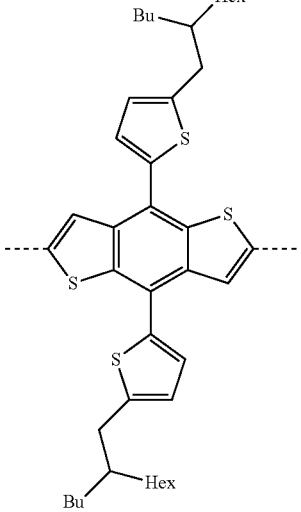 | n-hexyl | 2 | H | H |
| 9 | 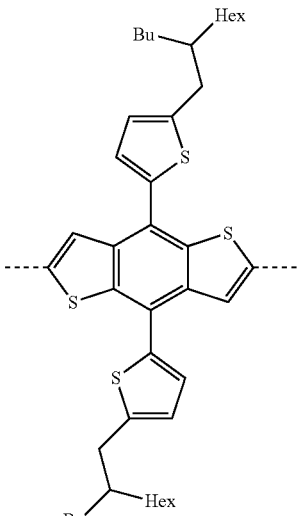 | n-hexyl | 1 | I | I |
| 10 | 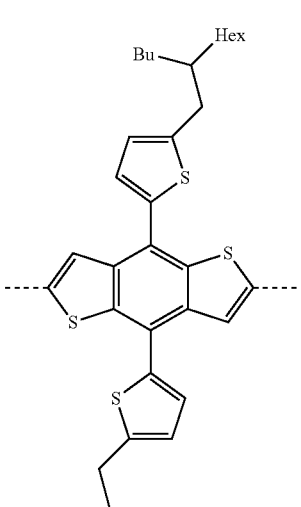 | n-hexyl | 2 | I | I |

TABLE 1-continued

| Exemplified compound | Y | R₁ | n | X1 | X2 |
|---|---|---|---|---|---|
| 11 | thiophene-substituted benzodithiophene with Bu/Hex branched alkyl groups | n-hexyl | 1 | Br | Br |
| 12 | thiophene-substituted benzodithiophene with Bu/Hex branched alkyl groups | n-hexyl | 2 | Br | Br |
| 13 | dithienopyrrolone with Oct/decyl branched N-alkyl group | n-hexyl | 1 | H | H |
| 14 | dithienopyrrolone with Oct/decyl branched N-alkyl group | n-hexyl | 2 | H | H |

TABLE 1-continued

| Exemplified compound | Y | R₁ | n | X1 | X2 |
|---|---|---|---|---|---|
| 15 | (structure with decyl, Oct, N, O, S substituents) | n-hexyl | 1 | H | H |
| 16 | (structure with decyl, Oct, N, O, S substituents) | n-hexyl | 2 | H | H |

In the tables above, Et is an ethyl group; Bu is a n-butyl group; Hex is a n-hexyl group; Oct is a n-octyl group; and decyl is a n-decyl group.

In the tables above, $R_1$, n, $X_1$, and $X_2$ are each independently both of two $R_1$, both of two n, both of two $X_1$, and both of two $X_2$.

(Electron-Accepting Material (C))

Examples of the electron-accepting material (C) include a N-type semiconductor material (e.g., a fullerene, and a fullerene derivative). Among the above-listed examples, a fullerene derivative is preferably a fullerene derivative in view of charge separation and charge transport.

The fullerene derivative means a compound having a fullerene skeleton.

The fullerene derivative may be appropriately synthesized for use, or may be selected from commercial products. Examples of the commercial products thereof include phenyl C71 butyric acid methyl ester (PC71BM), phenyl C61 butyric acid methyl ester (PC61BM), and a fullerene indene 2-adduct.

In addition to the N-type semiconductor material, an inorganic compound, such as zinc oxide, and titanium oxide, may be used.

An amount of the electron-accepting material (C) is preferably from 0.5% by mass through 10% by mass relative to a total amount of a solution for the photoelectric conversion layer.

<<Electron-Donating Material (B)>>

The electron-donating material (B) is not particularly limited as long as the electron-donating material (B) is a conjugated polymer material having a repeating unit structure, and energy level of the highest occupied molecular orbital (HOMO) thereof is 5.0 eV or greater. The energy level of the highest occupied molecular orbital (HOMO) is preferably from 5.0 eV through 5.6 eV. Examples thereof include 2,1,3-benzothiazole-based copolymers, quinoxaline-thiophene-based copolymers, thiophene-benzodithiophene-based copolymers, and polyfluorene-based polymers.

The 2,1,3-benzothiazole-based copolymer is a conjugated copolymer having a 2,1,3-benzothiazole skeleton in a principle chain thereof. Specific examples of the 2,1,3-benzothiazole-based copolymer include structures below. In the formulae below, n is an integer of from 1 through 1,000.

[Chem.10]

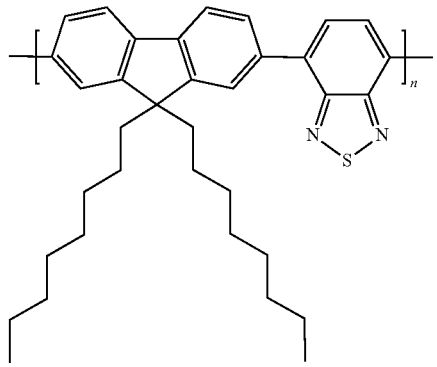

F8BT

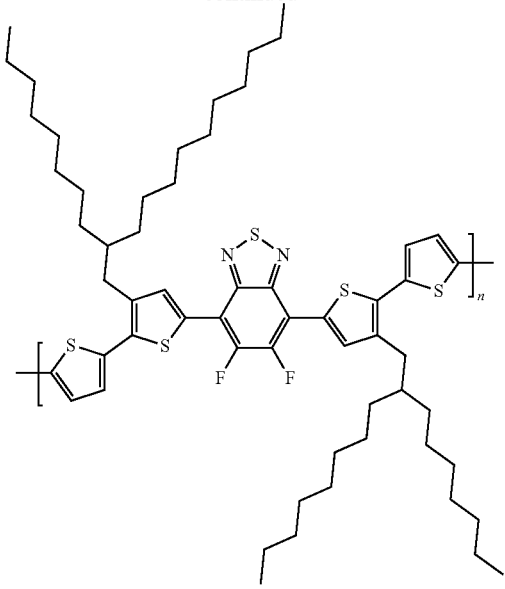

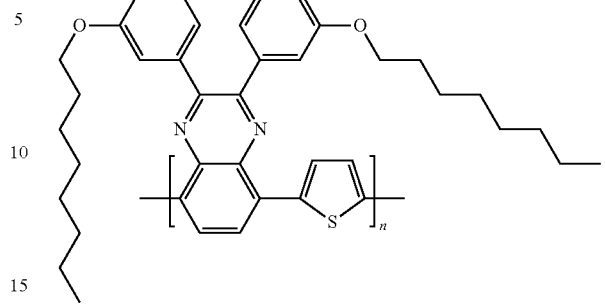

The thiophene-benzodithiophene-based polymer is a conjugated copolymer having a thiophene skeleton and a benzodithiophene skeleton in a principle chain thereof. Specific examples of the thiophene-benzodithiophene-based copolymer include structures below. In the formulae below, n is an integer of from 1 through 1,000.

[Chem.12]

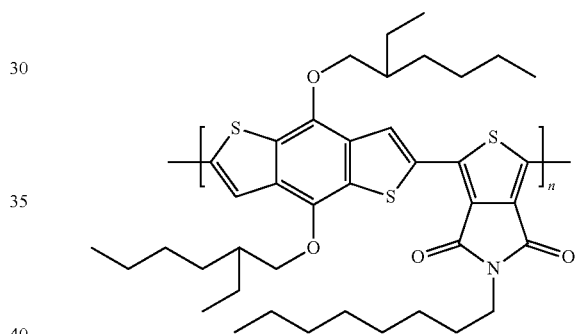

PBDTTPD

PCPDTBT

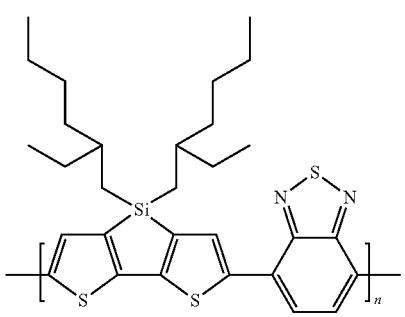

PCDTBT

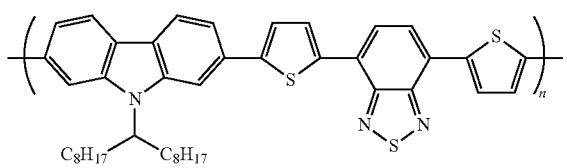

The quinoxaline-thiophene-based copolymer is a conjugated copolymer having a thiophene skeleton and a quinoxaline skeleton in a principle chain thereof. Specific examples of the quinoxaline-thiophene-based copolymer include structures below. In the formulae below, n is an integer of from 1 through 1,000.

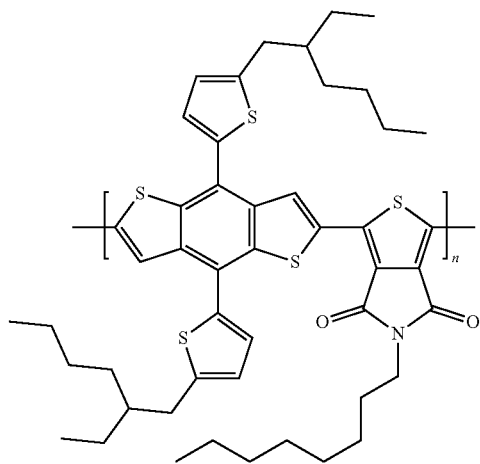

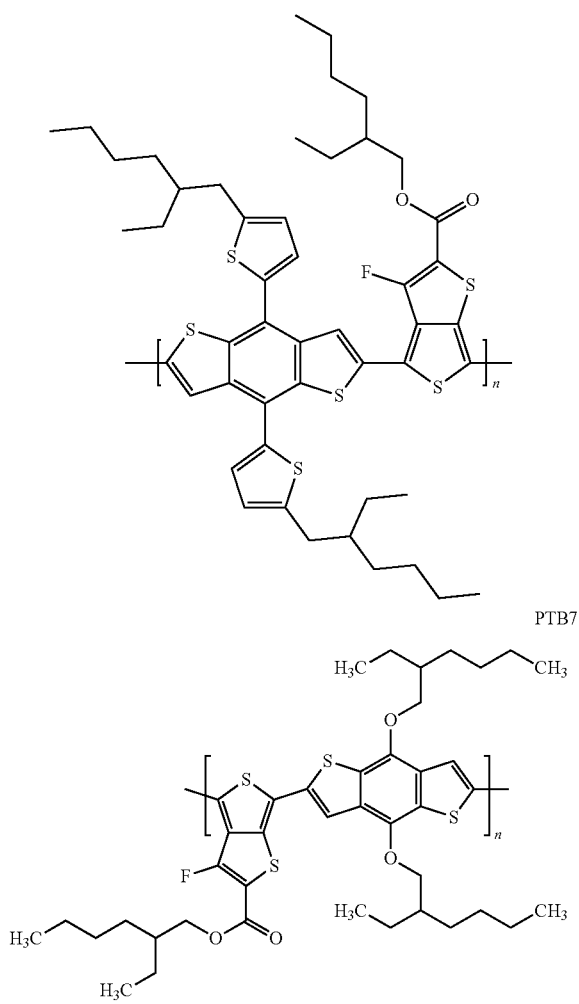

PCE-10

PTB7

<Photoelectric Conversion Layer>

The photoelectric conversion layer includes an organic material (A) represented by General Formula (1) above, an electron-donating material (B) having a repeating unit structure and having an energy level of the highest occupied molecular orbital (HOMO) being 5.0 eV or greater, and an electron-accepting material (C). The photoelectric conversion layer may further include other components according to the necessity.

The highest occupied molecular orbital of the electron-donating material (B) can be measured by photoelectron yield spectroscopy or cyclic voltammetry. Specific examples thereof include a measurement performed by a device, such as Rikenkeiki AC-3.

The average thickness of the photoelectric conversion layer is preferably from 50 nm through 400 nm, more preferably from 100 nm through 300 nm. When the average thickness is 50 nm or greater, light is sufficiently absorbed by the photoelectric conversion layer and carrier is sufficiently generated. When the average thickness is 400 nm or less, transport efficiency of carriers generated by light absorption is not reduced.

In the present disclosure, the organic material (A), the electron-donating material (B), and the electron-accepting material (C) may be sequentially formed to form flat junction interfaces. In order to increase an area of each junction interface, however, a bulk heterojunction where the above-mentioned materials are three-dimensionally mixed is preferably formed.

When materials having high solubility are used, the materials are dissolved in a solvent to form a solution where the organic material (A), the electron-donating material (B), and the electron-accepting material (C) are mixed in the state of molecules, and the solution is applied and then dried to remove the solvent, to thereby form a bulk heterojunction. Moreover, a heating treatment may be performed to optimize an aggregation state of each semiconductor.

When materials having poor solubility are used, the materials are dispersed in a solvent in which the organic material for use in the present disclosure is dissolved to prepare a solution, and the solution is applied to form a mixed layer. In this case, a heating treatment may be further performed to optimize an aggregation state of each semiconductor.

In the case where a photoelectric conversion layer is formed by mixing the organic material (A), the electron-donating material (B), and the electron-accepting material (C), the organic material (A), the electron-donating material (B), and the electron-accepting material (C) are added to a solvent at a desired mass ratio, and the mixture is dissolved using a method, such as heating, stirring, and ultrasonic wave irradiation, to prepare a solution, and the solution is applied onto an electrode. In this case, a photoelectric conversion efficiency of a photovoltaic element by mixing two or more solvents. As for the ratio, a mass ratio (A+B):C of the organic material (A), the electron-donating material (B), and the electron-accepting material (C) is from 1.0:1.0 through 3.0:1.0, and preferably from 1.2:1.0 through 2.0:1.0. Moreover, the electron-donating material (B) is preferably 20% by mass or less, and more preferably 10% by mass or less, relative to the organic material (A).

The organic solvent is not particularly limited and may be appropriately selected depending on the intended purpose. Examples of the organic solvent include methanol, ethanol, butanol, toluene, xylene, o-chlorophenol, acetone, ethyl acetate, ethylene glycol, tetrahydrofuran, dichloromethane, chloroform, dichloroethane, chlorobenzene, dichlorobenzene, trichlorobenzene, chloronaphthalene, dimethylformamide, dimethylsulfoxide, N-methylpyrrolidone, and gamma-butyrolactone. The above-listed examples may be used alone or in combination. Among the above-listed examples, chlorobenzene, chloroform, and ortho-dichlorobenzene are preferable.

The above-mentioned other components are not particularly limited and may be appropriately selected depending on the intended purpose. Examples of the above-mentioned other components include various additives, such as 1,8-diiodooctane, 1,8-octanedithiol, and 1-chloronaphthalene.

Examples of a formation method of the photoelectric conversion layer include spin coating, blade coating, slit-die coating, screen-printing coating, bar-coater coating, mold coating, print transfer, dip coating, inkjet printing, spray coating, and vacuum vapor deposition. Among the above-listed examples, the formation method can be appropriately selected depending on properties of a thin organic material film to be produced, such as thickness controlling, and orientation controlling.

For example, a concentration of the organic material (A), the electron-donating material (B), and the electron-accepting material (C) (a mass of the organic material (A), the electron-donating material (B), and the electron-accepting material (C) relative to a volume of a solution including the organic material (A), the electron-donating material (B), and the electron-accepting material (C), and a solvent) is preferably from 10 mg/mL through 100 mg/mL. With the above-mentioned concentration, a uniform photoelectric conversion layer can be easily produced.

In order to remove the organic solvent, an annealing treatment may be performed on the produced photoelectric conversion layer under reduced pressure or an inert atmosphere (a nitrogen or argon atmosphere). A temperature of the annealing treatment is preferably from 40 degrees Celsius through 300 degrees Celsius, and more preferably from 50 degrees Celsius through 150 degrees Celsius. Since the annealing treatment is performed, moreover, stacked layers are penetrated into each other at interfaces, to thereby increase a contact effective area. As a result, a short-circuit current may be increased. Note that, the annealing treatment may be performed after forming electrodes.

(Photoelectric Conversion Element)

The photoelectric conversion element of the present disclosure includes a photoelectric conversion layer on or above a substrate. The photoelectric conversion element preferably includes a first electrode, an electron-transporting layer, a photoelectric conversion layer, a hole-transporting layer, and a second electrode on or above a substrate. The photoelectric conversion element is preferably a photoelectric conversion element, in which a first electrode, an electron-transporting layer, a photoelectric conversion layer, a hole-transporting layer, and a second electrode are sequentially disposed on or above a substrate, or a photoelectric conversion element, in which a first electrode, a hole-transporting layer, a photoelectric conversion layer, an electron-transporting layer, and a second electrode are sequentially disposed on or above a substrate. The photoelectric conversion layer includes an organic material (A), an electron-donating material (B), and an electron-accepting material (C).

The photoelectric conversion element of the present disclosure will be described with reference to drawings.

FIG. 1 illustrates a structure where a first electrode 2, an electron-transporting layer 3, a photoelectric conversion layer 4, a hole-transporting layer 5, and a second electrode 6 are sequentially disposed on or above a substrate 1. Moreover, the photoelectric conversion element may have a structure where the direction for drawing charge is opposite to the above (a structure where a first electrode 2, a hole-transporting layer 5, a photoelectric conversion layer 4, an electron-transporting layer 3, and a second electrode 6 are sequentially disposed on or above a substrate 1).

<Substrate>

The substrate for use in the present disclosure is not particularly limited and any of substrates known in the art can be used as the substrate. The substrate 1 is preferably a substrate formed of a transparent material. Examples of the substrate include glass, a transparent plastic plate, a transparent plastic film, and an inorganic transparent crystal.

<Electrodes>

As the electrodes, either or both of a first electrode 2 and a second electrode 6 transparent to visible light is used, and the other electrode may be transparent or opaque.

The electrode transparent to visible light is not particularly limited and any of electrodes typically used in photoelectric conversion elements or liquid crystal panels may be used. Examples of the transparent electrode include conductive metal oxides, such as tin-doped indium oxide (referred to as "ITO" hereinafter), fluorine-doped tin oxide (referred to as "FTO" hereinafter), antimony-doped tin oxide (referred to as "ATO" hereinafter), and aluminium- or gallium-doped zinc oxide (referred respectively as "AZO," and "GZO" hereinafter).

An average thickness of the electrode transparent to visible light is preferably from 5 nm through 10 micrometers, and more preferably from 50 nm through 1 micrometer.

In order to maintain certain hardness, the electrode transparent to visible light is preferably disposed on a substrate formed of a material transparent to visible light. A product of the electrode and the substrate that are integrated can also be used. Examples of the integrated product include FTO coated glass, ITO coated glass, zinc oxide-aluminium coated glass, FTO coated transparent plastic films, and ITO coated transparent plastic films.

The electrode transparent to visible light may be an electrode containing a substrate (e.g., a glass substrate) on which a metal electrode having the structure through which light can pass (e.g., a mesh-patterned structure or a stripe-patterned structure) is disposed. Alternatively, the electrode transparent to visible light may be an electrode where carbon nanotube or graphene is laminated on the substrate in a manner that transparency is secured. The above-listed examples may be used alone, or in combination, or in the state of a laminate.

In order to reduce substrate resistance, moreover, a metal lead wire may be used. Examples of a material of the metal lead wire include metals, such as aluminium, copper, silver, gold, platinum, and nickel. The metal lead wire is disposed on the substrate, for example, by vapor deposition, sputtering, or crimping, followed by disposing ITO or FTO on the metal.

In the case where an opaque electrode is used for either a first electrode or a second electrode, examples of a material thereof include metals (e.g., platinum, gold, silver, copper, and Al) and graphite. In case of the opaque electrode, a thickness of the electrode is not particularly limited and the electrode may have a laminate structure of one or two or more materials.

<Electron-Transporting Layer (First Layer)>

A material for forming the electron-transporting layer may be appropriately selected depending on the intended purpose. For example, the electron-transporting layer is formed by applying an electron-accepting organic material [e.g., perylenetetracarboxylic anhydride, perylenetetracarboxylic diimide, oxazole derivatives, triazol derivatives, phenanthroline derivatives, phosphine oxide derivatives, fullerene compounds, CNT, and CN-PPV], or an inorganic material (e.g., zinc oxide, titanium oxide, lithium fluoride, and calcium metal) through a sol-gel method or sputtering. Among the above-listed examples, metal oxides, such as zinc oxide, titanium oxide, and tin oxide, are preferable. The above-listed metal oxides may be doped with another metal. An average thickness of the electron-transporting layer is not particularly limited and may be appropriately selected depending on the intended purpose. The electron-transporting layer preferably covers the entire surface as thin as possible, and more preferably has an average thickness of from 10 nm through 100 nm.

<Electron-Transporting Layer (Second Layer)>

For example, the electron-transporting layer includes a first layer including a metal oxide, such as zinc oxide, titanium oxide, and tin oxide, and a second layer disposed between the first layer and the photoelectric conversion layer. The second layer preferably includes an amine compound represented by General Formula (5) below.

[Chem.13]

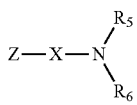

General Formula (5)

In General Formula (5), $R_5$ and $R_6$ are each independently an alkyl group having from 1 through 4 carbon atoms; X is a divalent aromatic group having from 6 through 14 carbon atoms or an alkylene group having from 1 through 4 carbon atoms; $R_5$ and $R_6$ may be bonded to form a ring; and Z is represented by one of substituents below.

—COOH

—P(=O)(OH)$_2$

—Si(OH)$_3$

[Chem. 14]

A of General Formula (5) is preferably —COOH, and a film of basic carboxylic acid may be formed on an electron-transporting layer. Specific examples of the basic carboxylic acid include 4-(N,N-dimethylamino)-benzoic acid, 4-(N,N-diethylamino)-benzoic acid, and 4-(N,N-dibenzylamino)-benzoic acid.

<Hole-Transporting Layer>

The hole-transporting layer is disposed to improve a collection efficiency of holes. Specifically, the hole-transporting layer is formed by depositing a hole-transporting organic compound, such as a conductive polymer [e.g., PEDOT:PSS (polyethylene dioxythiophene:polystyrene sulfonic acid)] and an aromatic amine derivative, or an inorganic compound having hole-transporting properties, such as molybdenum oxide, tungsten oxide, vanadium oxide, and nickel oxide, through spin coating, a sol-gel method, sputtering, or vacuum vapor deposition. In the present disclosure, molybdenum oxide is preferably disposed.

An average thickness of the hole-transporting layer is not particularly limited and may be appropriately selected depending on the intended purpose. The hole-transporting layer preferably covers the entire surface as thin as possible, and the average thickness of the hole-transporting layer is more preferably from 1 nm through 50 nm.

<Other Members>

The above-mentioned other members are not particularly limited and may be appropriately selected depending on the intended purpose. Examples of the members include a gas-barrier layer, a protective layer, and a passivation layer. Examples of materials of the gas-barrier layer, the protective layer, and the passivation layer include inorganic materials, such as silicon nitrate, silicon oxide, and aluminium oxide.

The photoelectric conversion element of the present disclosure may have a series junction formed by stacking two or more photoelectric conversion layers (making as a tandem) via one or more intermediate electrodes.

Examples of the laminate structure include a laminate structure including a substrate/a first electrode/a hole-transporting layer/a first photoelectric conversion layer/an intermediate electrode/a second photoelectric conversion layer/an electron-transporting layer/a second electrode. Use of the laminate can improve open-circuit voltage.

In case of the above-described laminate structure, at least one of the photoelectric conversion layers includes the organic material (A) represented by General Formula (1), the electron-donating material (B) having a repeating unit structure and having an energy level of the highest occupied molecular orbital (HOMO) being 5.0 eV or greater, and the electron-accepting material (C), and the other photoelectric conversion layer preferably includes another organic material having an absorption wavelength different from that of the organic compound (A) represented by General Formula (1), in order to prevent reduction of short-circuit current.

Examples of another organic material having an absorption wavelength different from that of the organic compound (A) represented by General Formula (1) include: polymer materials, such as polythiophene compounds, polyphenylene vinylene compounds, polyfluorene compounds, and polyphenylene compounds; and low-molecular-weight materials, such as various porphyrins, and phthalocyanine.

<<Use>>

Recently, there is a need for, especially as an energy harvesting element, a photoelectric conversion element capable of efficiently generating electric power with weak light. Typical examples of weak light include LED light, and light of a fluorescent lamp. The above-mentioned light is typically used indoor, and is called indoor light. The illuminance of the indoor light is from about 20 Lux through about 1,000 Lux, and the indoor light is very weak light compared to direct sunlight (about 100,000 Lux).

The photoelectric conversion element of the present disclosure exhibits high conversion efficiency with weak light, such as the above-mentioned indoor light, or strong light, such as sunlight, and can be applied for a power supply by using in combination with a circuit board capable of controlling the generated electric current.

A basic structure of the device mounted in the photoelectric conversion element is illustrated in FIG. 2. The photoelectric conversion element 10 illustrated in FIG. 2 generates electricity when the photoelectric conversion element receives light. The device circuit 11 can be driven by receiving the electricity.

Moreover, output of the photoelectric conversion element 10 generally changes depending on surrounding illuminance. In order to supply stable voltage to the side of the device circuit 11, a power supply IC 12 for the photoelectric conversion element is generally disposed between the photoelectric conversion element 10 and the device circuit 11. The structure described above is illustrated in FIG. 3.

To prepare a case where light is not applied to the photoelectric conversion element 10 and electricity cannot be generated, a power storage device 13, such as a capacitor, is disposed between the power supply IC 12 and the device circuit 11, and therefore the power storage device 13 can be charged by excess electricity from the photoelectric conversion element 10. In the case where light is not applied to the photoelectric conversion element 10, the device can be driven by supplying the electricity stored in the power storage device 13 to the device circuit 11. The structure described above is illustrated in FIG. 4.

FIGS. 5 and 6 illustrate structures of devices known in the art.

The device known in the art is coupled with a commercial power supply 20 and is driven by converting alternating current into direct current power supply by a AC-DC converter 22 and supplying to the device circuit 21 (FIG. 5). Alternatively, a battery cell 23 is disposed inside the device, and the device circuit 21 is driven by electricity of the battery cell (FIG. 6).

However, the devices known in the art cannot be driven unless the devices are connected to a commercial power supply. A device driven by a battery cell needs replacement of the battery cell when the battery cell is run out.

The devices of FIGS. 2 to 4 can be driven in an environment where there is no commercial power supply, and can be continuously driven without replacing a battery cell.

FIGS. 7 and 8 illustrate schematic examples of the power supply module of the present disclosure.

The photoelectric conversion element 10 is coupled with a power supply IC 12 for the photoelectric conversion element (FIG. 7). In this manner, a direct current power supply module, which can supply electricity generated by receiving light in the photoelectric conversion element 10 with the power supply IC 12 at a constant voltage level, can be constructed. As a power storage device 13 is added to output of the power supply IC 12 (FIG. 8), moreover, the electricity generated by the photoelectric conversion element 10 is stored in the power storage device 13. In this manner, a power supply module capable of supplying electricity even in the state where no light is applied can be constructed.

The power supply modules of FIGS. 7 and 8 can be continuously used as a power supply module without replacing a battery cell, unlike a primary battery cell known in the art.

Examples of a device utilizing the power supply include calculators, and watches. Other than the above-listed examples, a power supply containing the photoelectric conversion element of the present disclosure can be used in mobile phones, electric organizers, and electronic paper. Moreover, a power supply containing the photoelectric conversion element of the present disclosure can also be used as an auxiliary power for extending continuous usage of rechargeable or battery-driven electric appliances. Furthermore, the photoelectric conversion element of the present disclosure can be also applied as an image sensor. Moreover, the electronic device has been made wearable, and there is a need for flexibility of a power supply device. What is just mentioned is also applied for an energy harvesting elements. The present disclosure can be sufficiently used as a power supply and supplemental power supply of an electronic device to which flexibility is desired. However, the present disclosure can be also used as a power supply and supplemental power supply of an electronic device to which flexibility is not desired.

EXAMPLES

Comparative Example 1

(Production of Photoelectric Conversion Layer Coating Liquid)

In 1 mL of chloroform, 19 mg of Exemplified Compound 2, 1 mg of P3HT (poly(3-hexylthiophene), available from Aldrich, Mn=54,000, HOMO 4.8 eV), and 10 mg of PC61BM (available from Aldrich) were dissolved.

(Transparent Electrode)

A glass substrate on which a film of ITO having a thickness of 150 nm was formed was obtained from GEOMATEC Co., Ltd.

(Production of Solar Battery Cell)

1. Formation of Electron-Transporting Layer

Onto glass (15 ohm/square) on which an ITO film had been formed in advance, zinc oxide nanoparticles (available from Aldrich, the average particle diameter: 12 nm) were applied by spin coating at 3,000 rpm, followed by drying for 10 minutes at 80 degrees Celsius, to thereby form an electron-transporting layer having a film thickness of about 30 nm.

2. Formation of Photoelectric Conversion Layer

Onto the resultant, a photoelectric conversion layer coating liquid was applied by spin coating at 1,000 rpm, to thereby form a photoelectric conversion layer having a thickness of about 150 nm.

3. Formation of Hole-Transporting Layer and Formation of Upper Electrode

On the photoelectric conversion layer, molybdenum oxide (available from KOJUNDO CHEMICAL LABORATORY CO., LTD.) in the film thickness of 10 nm and silver in the film thickness of 100 nm were sequentially formed by vacuum vapor deposition, to thereby produce a solar battery cell element.

(Evaluation of Properties of Solar Battery Cell)

Conversion efficiency of the obtained element with irradiation of which LED (0.07 mW/cm$^2$) and conversion efficiency thereof with AM1.5 (100 mW/cm$^2$) were measured.

The measurement was performed by using a desk lamp CDS-90 alpha available from Cosmotechno Co., Ltd. as the white LED, using a simulated sunlight irradiation device available from Bunkoukeiki Co., Ltd. as the AM1.5, and a solar battery evaluation system As-510-PV03 available from NF Corporation as the evaluation device. The output of the LED light source was measured by means of a color meter C-7000 available from SEKONIC CORPORATION. The results are presented in Table 2.

Comparative Example 2

In Comparative Example 1, a liquid obtained by dissolving dimethylamino benzoic acid in ethanol to give concentration of 1 mg/mL was applied onto the electron-transporting layer by spin coating at 3,000 rpm to form a film. Other than that, evaluations were performed in the same manner as in Comparative Example 1. The results are presented in Table 2.

Example 1

Evaluations were performed in the same manner as in Comparative Example 2, except that the photoelectric conversion layer coating liquid was replaced with A below. The results are presented in Table 2.

(Production of Photoelectric Conversion Layer Coating Liquid A)

In 1 mL of chloroform, 19 mg of Exemplified Compound 2, 1 mg of PCDTBT (available from Ossila Ltd., HOMO: 5.4 eV), and 10 mg of PC61BM (available from Aldrich) were dissolved.

Example 2

Evaluations were performed in the same manner as in Comparative Example 2, except that the photoelectric conversion layer coating liquid was replaced with B below. The results are presented in Table 2.

(Production of Photoelectric Conversion Layer Coating Liquid B)

In 1 mL of chloroform, 19 mg of Exemplified Compound 2, 1 mg of F8BT (available from Ossila Ltd., HOMO: 5.9 eV), and 10 mg of PC61BM (available from Aldrich) were dissolved.

Example 3

Evaluations were performed in the same manner as in Comparative Example 2, except that the photoelectric conversion layer coating liquid was replaced with C below. The results are presented in Table 2.
(Production of Photoelectric Conversion Layer Coating Liquid C)
In 1 mL of chloroform, 19 mg of Exemplified Compound 2, 1 mg of PBDTTPD (available from Ossila Ltd., HOMO: 5.4 eV), and 10 mg of PC61BM (available from Aldrich) were dissolved.

Example 4

Evaluations were performed in the same manner as in Comparative Example 2, except that the photoelectric conversion layer coating liquid was replaced with D below. The results are presented in Table 2.
(Production of Photoelectric Conversion Layer Coating Liquid D)
In 1 mL of chloroform, 19 mg of Exemplified Compound 2, 1 mg of PTB7 (available from Ossila Ltd., HOMO: 5.1 eV), and 10 mg PC61BM (available from Aldrich) were dissolved.

Example 5

Evaluations were performed in the same manner as in Comparative Example 2, except that the photoelectric conversion layer coating liquid was replaced with E below. The results are presented in Table 2.
(Production of Photoelectric Conversion Layer Coating Liquid E)
In 1 mL of chloroform, 19 mg of Exemplified Compound 2, 1 mg of PCE-10 (available from Ossila Ltd., HOMO: 5.2 eV), and 10 mg of PC61BM (available from Aldrich) were dissolved.

Example 6

Evaluations were performed in the same manner as in Comparative Example 2, except that the photoelectric conversion layer coating liquid was replaced with F below. The results are presented in Table 2.
(Production of Photoelectric Conversion Layer Coating Liquid F)
In 1 mL of chloroform, 19 mg of Exemplified Compound 1, 1 mg of PCDTBT (available from Ossila Ltd., HOMO: 5.4 eV), and 10 mg of PC61BM (available from Aldrich) were dissolved.

Example 7

Evaluations were performed in the same manner as in Comparative Example 2, except that the photoelectric conversion layer coating liquid was replaced with G below. The results are presented in Table 2.
(Production of Photoelectric Conversion Layer Coating Liquid G)
In 1 mL of chloroform, 19 mg of Exemplified Compound 4, 1 mg of PCDTBT (available from Ossila Ltd., HOMO: 5.4 eV), and 10 mg of PC61BM (available from Aldrich) were dissolved.

Example 8

Evaluations were performed in the same manner as in Comparative Example 2, except that the photoelectric conversion layer coating liquid was replaced with H below. The results are presented in Table 2.
(Production of Photoelectric Conversion Layer Coating Liquid H)
In 1 mL of chloroform, 19 mg of Exemplified Compound 6, 1 mg of PCDTBT (available from Ossila Ltd., HOMO: 5.4 eV), and 10 mg of PC61BM (available from Aldrich) were dissolved.

Example 9

Evaluations were performed in the same manner as in Comparative Example 2, except that the photoelectric conversion layer coating liquid was replaced with I below. The results are presented in Table 2.
(Production of Photoelectric Conversion Layer Coating Liquid I)
In 1 mL of chloroform, 19 mg of Exemplified Compound 14, 1 mg of PCDTBT (available from Ossila Ltd., HOMO: 5.4 eV), and 10 mg of PC61BM (available from Aldrich) were dissolved.

Example 10

Evaluations were performed in the same manner as in Comparative Example 2, except that the photoelectric conversion layer coating liquid was replaced with J below. The results are presented in Table 2.
(Production of Photoelectric Conversion Layer Coating Liquid J)
In 1 mL of chloroform, 19 mg of Exemplified Compound 16, 1 mg of PCDTBT (available from Ossila Ltd., HOMO: 5.4 eV), and 10 mg of PC61BM (available from Aldrich) were dissolved.

Example 11

Evaluations were performed in the same manner as in Comparative Example 2, except that the photoelectric conversion layer coating liquid was replaced with K below. The results are presented in Table 2.
(Production of Photoelectric Conversion Layer Coating Liquid K)
In 1 mL of chloroform, 18 mg of Exemplified Compound 2, 2 mg of (available from Ossila Ltd., HOMO: 5.4 eV), and 10 mg of PC61BM (available from Aldrich) were dissolved.

Example 12

Evaluations were performed in the same manner as in Comparative Example 2, except that the photoelectric conversion layer coating liquid was replaced with L below. The results are presented in Table 2.
(Production of Photoelectric Conversion Layer Coating Liquid L)
In 0.8 mL of chloroform, 14 mg of Exemplified Compound 2, 1 mg of PCDTBT (available from Ossila Ltd., HOMO: 5.4 eV), and 10 mg of PC61BM (available from Aldrich) were dissolved.

Example 13

Evaluations were performed in the same manner as in Comparative Example 2, except that the photoelectric conversion layer coating liquid was replaced with M below. The results are presented in Table 2.

(Production of Photoelectric Conversion Layer Coating Liquid M)

In 1.2 mL of chloroform, 24 mg of Exemplified Compound 2, 1 mg of PCDTBT (available from Ossila Ltd., HOMO: 5.4 eV), and 10 mg of PC61BM (available from Aldrich) were dissolved.

Example 14

Evaluations were performed in the same manner as in Comparative Example 2, except that the photoelectric conversion layer coating liquid was replaced with N below. The results are presented in Table 2.
(Production of Photoelectric Conversion Layer Coating Liquid N)

In 1.3 mL of chloroform, 29 mg of Exemplified Compound 2, 1 mg of PCDTBT (available from Ossila Ltd., HOMO: 5.4 eV), and 10 mg of PC61BM (available from Aldrich) were dissolved.

Example 15

Evaluations were performed in the same manner as in Comparative Example 2, except that the photoelectric conversion layer coating liquid was replaced with O below. The results are presented in Table 2.
(Production of Photoelectric Conversion Layer Coating Liquid O)

In 1 mL of chloroform, 17 mg of Exemplified Compound 2, 3 mg of PCDTBT (available from Ossila Ltd., HOMO: 5.4 eV), and 10 mg of PC61BM (available from Aldrich) were dissolved.

Comparative Example 3

Evaluations were performed in the same manner as in Comparative Example 2, except that the photoelectric conversion layer coating liquid was replaced with P below. The results are presented in Table 2.
(Production of Photoelectric Conversion Layer Coating Liquid P)

In 1.7 mL of chloroform, 36 mg of Exemplified Compound 2, 4 mg of PCDTBT (available from Ossila Ltd., HOMO: 5.4 eV), and 10 mg of PC61BM (available from Aldrich) were dissolved.

Comparative Example 4

Evaluations were performed in the same manner as in Comparative Example 2, except that the photoelectric conversion layer coating liquid was replaced with Q below. The results are presented in Table 2.
(Production of Photoelectric Conversion Layer Coating Liquid Q)
In 0.6 mL of chloroform, 8 mg of Exemplified Compound 2, 0.8 mg of PCDTBT (available from Ossila Ltd., HOMO: 5.4 eV), and 10 mg of PC61BM (available from Aldrich) were dissolved.

Comparative Example 5

Evaluations were performed in the same manner as in Comparative Example 2, except that the photoelectric conversion layer coating liquid was replaced with R below. The results are presented in Table 2.
(Production of Photoelectric Conversion Layer Coating Liquid R)

In 1 mL of chloroform, 20 mg of Exemplified Compound 2 and 10 mg of PC61BM (available from Aldrich) were dissolved.

Comparative Example 6

Evaluations were performed in the same manner as in Comparative Example 2, except that the photoelectric conversion layer coating liquid was replaced with S below. The results are presented in Table 2.
(Production of Photoelectric Conversion Layer Coating Liquid S)

In 1 mL of chloroform, 20 mg of Exemplified Compound 4 and 10 mg of PC61BM (available from Aldrich) were dissolved.

Comparative Example 7

Evaluations were performed in the same manner as in Comparative Example 2, except that the photoelectric conversion layer coating liquid was replaced with U below. The results are presented in Table 2.
(Production of Photoelectric Conversion Layer Coating Liquid U)

In 1 mL of chlorobenzene including 3% by volume 1,8-diiodooctane, 12 mg of PTB7 (available from Ossila Ltd.), and 18 mg of PC61BM (available from Aldrich) were dissolved.

Comparative Example 8

Evaluations were performed in the same manner as in Comparative Example 2, except that the photoelectric conversion layer coating liquid was replaced with V below. The results are presented in Table 2.
(Production of Photoelectric Conversion Layer Coating Liquid V)

In 1 mL of chloroform, 12 mg of PCDTBT (available from Ossila Ltd.) and 18 mg of PC61BM (available from Aldrich) were dissolved.

Comparative Example 9

Evaluations were performed in the same manner as in Comparative Example 2, except that the photoelectric conversion layer coating liquid was replaced with W below. The results are presented in Table 2.
(Production of Photoelectric Conversion Layer Coating Liquid W)

In 0.67 mL of chlorobenzene, 15 mg of P3HT (available from Ossila Ltd.) and 10 mg of PC61BM (available from Aldrich) were dissolved.

TABLE 2

| | Organic material (A) | Electron donating material (B) Compound | HOMO (eV) | Electron accepting compound (C) | (A):(B):(C) (mass ratio) | [(A): + (B)]: (C) (mass ratio) | LED conversion efficiency | AM1.5 conversion efficiency |
|---|---|---|---|---|---|---|---|---|
| Comp. Ex. 1 | Exemplified Compound 2 | P3HT | 4.8 | PC61BM | 1.9/0.1/1.0 | 2.0:1.0 | 100% | 1.3% |
| Comp. Ex. 2 | Exemplified Compound 2 | P3HT | 4.8 | PC61BM | 1.9/0.1/1.0 | 2.0:1.0 | 11.2% | 1.8% |
| Ex. 1 | Exemplified Compound 2 | PCDTBT | 5.4 | PC61BM | 1.9/0.1/1.0 | 2.0:1.0 | 16.0% | 5.9% |
| Ex. 2 | Exemplified Compound 2 | F8BT | 5.9 | PC61BM | 1.9/0.1/1.0 | 2.0:1.0 | 12.8% | 3.1% |
| Ex. 3 | Exemplified Compound 2 | PBDTTPD | 5.5 | PC61BM | 1.9/0.1/1.0 | 2.0:1.0 | 13.3% | 3.1% |
| Ex. 4 | Exemplified Compound 2 | PTB7 | 5.1 | PC61BM | 1.9/0.1/1.0 | 2.0:1.0 | 14.1% | 5.1% |
| Ex. 5 | Exemplified Compound 2 | PCE10 | 5.2 | PC61BM | 1.9/0.1/1.0 | 2.0:1.0 | 14.6% | 5.3% |
| Ex. 6 | Exemplified Compound 2 | PCDTBT | 5.4 | PC61BM | 1.9/0.1/1.0 | 2.0:1.0 | 12.1% | 4.1% |
| Ex. 7 | Exemplified Compound 4 | PCDTBT | 5.4 | PC61BM | 1.9/0.1/1.0 | 2.0:1.0 | 17.1% | 6.8% |
| Ex. 8 | Exemplified Compound 6 | PCDTBT | 5.4 | PC61BM | 1.9/0.1/1.0 | 2.0:1.0 | 14.8% | 3.9% |
| Ex. 9 | Exemplified Compound 14 | PCDTBT | 5.4 | PC61BM | 1.9/0.1/1.0 | 2.0:1.0 | 17.5% | 5.9% |
| Ex. 10 | Exemplified Compound 16 | PCDTBT | 5.4 | PC61BM | 1.9/0.1/1.0 | 2.0:1.0 | 14.3% | 5.1% |
| Ex. 11 | Exemplified Compound 2 | PCDTBT | 5.4 | PC61BM | 1.8/0.2/1.0 | 2.0:1.0 | 15.1% | 5.4% |
| Ex. 12 | Exemplified Compound 2 | PCDTBT | 5.4 | PC61BM | 1.4/0.1/1.0 | 1.5:1.0 | 16.2% | 6.1% |
| Ex. 13 | Exemplified Compound 2 | PCDTBT | 5.4 | PC61BM | 2.4/0.1/1.0 | 2.5:1.0 | 13.5% | 4.1% |
| Ex. 14 | Exemplified Compound 2 | PCDTBT | 5.4 | PC61BM | 2.9/0.1/1.0 | 3.0:1.0 | 13.1% | 3.8% |
| Ex. 15 | Exemplified Compound 2 | PCDTBT | 5.4 | PC61BM | 1.7/0.3/1.0 | 2.0:1.0 | 11.2% | 2.2% |
| Comp. Ex. 3 | Exemplifie.d Compound 2 | PCDTBT | 5.4 | PC61BM | 3.6/0.4/1.0 | 4.0:1.0 | 10.5% | 1.8% |
| Comp. Ex. 4 | Exemplified Compound 2 | PCDTBT | 5.4 | PC61BM | 0.8/0.08/1.0 | 0.88:1.0 | 9.9% | 1.5% |
| Comp. Ex. 6 | Exemplified Compound 2 | NA | NA | PC61BM | 2.0/0/1.0 | 2.0:1.0 | 7.8% | 0.8% |
| Comp. Ex. 6 | Exemplified Compound 4 | NA | NA | PC61BM | 2.0./0/1.0 | 2.0:1.0 | 8.9% | 1.1% |
| Comp. Ex. 7 | NA | PTB7 | 5.1 | PC61BM | 0/1.2/1.8 | 1.2:1.8 | 8.1% | 4.7% |
| Comp. Ex. 8 | NA | PCDTBT | 5.4 | PC61BM | 8/1.2/1.8 | 1.2:1.8 | 6.9% | 1.2% |
| Comp. Ex. 9 | NA | P3HT | 4.8 | PC61BM | 0/1.5/1.0 | 1.5:1.0 | 4.5% | 2.3% |

In Table 2, NA is an abbreviation of "not available."
Note that, the structure of P3HT is as follows.

[Chem.15]

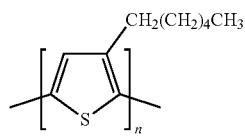

where n is an integer of 1 or greater.
PC61BM is phenyl-C61-butyric acid methyl ester.

Example 20

In the structure of the photoelectric conversion element of Example 2, the photoelectric conversion element 10, the power supply IC 12, and the power storage device 13 were combined, and electricity supplied from the combination thereof was connected to a power supply of the mouse control circuit 14 of the mouse (FIG. 9). When the mouse was not used, the mouse was charged, and the mouse could be driven by the charged electricity. Therefore, a need for replacing a battery cell could be avoided. FIG. 10 illustrates an image where the photoelectric conversion element is mounted in the mouse 15. The photoelectric conversion element, the power supply IC, and the power storage device are mounted inside the mouse, but an upper part of the photoelectric conversion element is covered with a transparent cover in order to allow light to reach the photoelectric conversion element.

As described above, it was found that the photoelectric conversion elements produced with the structure of the present disclosure had high conversion efficiency under irradiation of low illuminance LED and simulated sunlight AM1.5, compared to the comparative photoelectric conversion elements.

REFERENCE SIGNS LIST

1: substrate
2: first electrode
3: electron-transporting layer
4: photoelectric conversion layer
5: hole-transporting layer
6: second electrode
10: photoelectric conversion element
11: device circuit
12: power supply IC
13: power storage device
14: mouse control circuit
15: mouse
20: commercial power supply
21: device circuit
22: AC-DC converter
23: battery cell

The invention claimed is:

1. A photoelectric conversion element comprising:
a substrate; and
a photoelectric conversion layer disposed on or above the substrate,
wherein the photoelectric conversion layer includes an organic material (A) represented by Formula (1) below, an electron-donating material (B) having a repeating unit structure and having an energy level of a highest occupied molecular orbital (HOMO) being 5.0 eV or greater, and an electron-accepting material (C),
wherein a mass ratio (A+B):C of the organic material (A), the electron-donating material (B), and the electron-accepting material (C) is from 1.0:1.0 through 3.0:1.0, Formula (1)

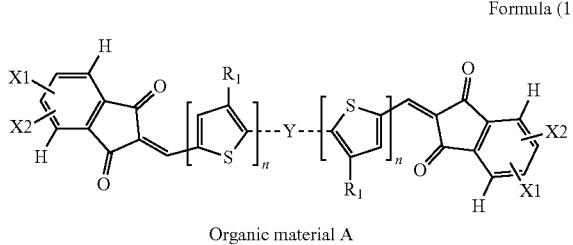

Organic material A where, in the Formula (1), $R_1$ is each independently an alkyl group having from 2 through 8 carbon atoms; n is each independently an integer of from 1 through 2; X1 and X2 are each independently a hydrogen atom or a halogen atom; and Y is represented by Formula (2), Formula (3), or Formula (4) below and $R_2$ to $R_4$ are each independently an alkyl group having from 8 through 22 carbon atoms, Formula (2)

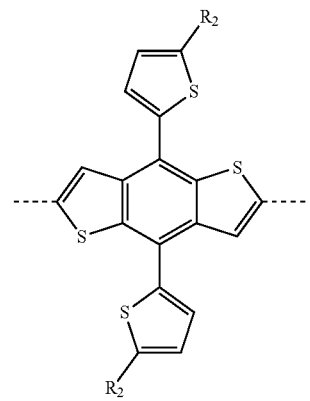

Formula (3)

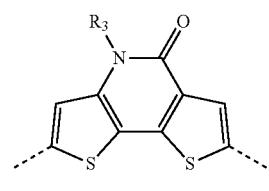

Formula (4)

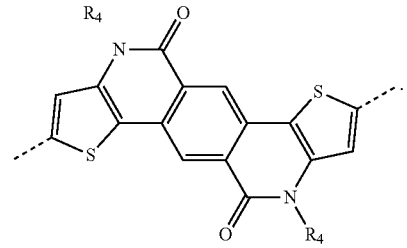

2. The photoelectric conversion element according to claim 1, wherein the electron-accepting material (C) is a fullerene derivative.

3. The photoelectric conversion element according to claim 1,
wherein the photoelectric conversion element is a photoelectric conversion element including a first electrode, an electron-transporting layer, the photoelectric conversion layer, a hole-transporting layer, and a second electrode disposed on or above the substrate.

4. The photoelectric conversion element according to claim 3,
wherein the electron-transporting layer includes at least one metal oxide selected from the group consisting of zinc oxide, titanium oxide, and tin oxide.

5. The photoelectric conversion element according to claim 3,
wherein the hole-transporting layer includes at least one metal oxide selected from the group consisting of molybdenum oxide, tungsten oxide, and vanadium oxide.

6. The photoelectric conversion element according to claim 3,
wherein the electron-transporting layer includes a first layer including at least one metal oxide selected from the group consisting of zinc oxide, titanium oxide, and tin oxide, and a second layer disposed between the first layer and the photoelectric conversion layer, where the second layer includes an amine compound represented by Formula (5) below,

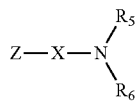

Formula (5)

where, in the Formula (5), $R_5$ and $R_6$ are each independently an alkyl group having from 1 through 4 carbon atoms; X is a divalent aromatic group having from 6 through 14 carbon atoms or an alkylene group having from 1 through 4 carbon atoms; $R_5$ and $R_6$ may be bonded to form a ring; and Z is represented by one of substituents below,

—COOH

—P(=O)(OH)$_2$

—Si(OH)$_3$.

7. A device comprising:
the photoelectric conversion element according to claim 1, wherein the device is driven by electricity generated by the photoelectric conversion element.

8. A power supply module comprising:
the photoelectric conversion element according to claim 1.

* * * * *